United States Patent [19]

Lee

[11] Patent Number: 5,780,915
[45] Date of Patent: Jul. 14, 1998

[54] SEMICONDUCTOR DEVICE HAVING SPIRAL ELECTRODE PATTERN

[75] Inventor: Seung-Ho Lee, Seoul, Rep. of Korea

[73] Assignee: LG Semicon Co., Ltd., Cheongju, Rep. of Korea

[21] Appl. No.: 772,288

[22] Filed: Dec. 23, 1996

[30] Foreign Application Priority Data

Dec. 30, 1995 [KR] Rep. of Korea ............... 68667/1995
Nov. 21, 1996 [KR] Rep. of Korea ............... 56007/1996

[51] Int. Cl.$^6$ ...................................................... H01L 31/00
[52] U.S. Cl. ..................... 257/448; 257/457; 257/459; 257/465; 257/745
[58] Field of Search .............................. 257/448, 453, 257/457, 459, 465, 692, 695, 745

[56] References Cited

U.S. PATENT DOCUMENTS 5,451,769 9/1995 McAdoo et al. ...................... 257/457

OTHER PUBLICATIONS

Yang, L., et al., "High Performance of Fe:InP/InGaAs Metal/Semiconductor/Metal Photodetectors Grown by Metalorganic Vapor Phase Epitaxy," IEEE Photonics Technol. Letts., vol. 2, No. 1, Jan. 1990, pp. 56–58.

Kuhl, D., et al., "Inductive Bandwidth Enhancement of Sub-μm InAlAs–InGaAs MSM Photodetectors," IEEE Photonics Technol. Letts., vol. 7, No. 4, Apr. 1995, pp. 421–423.

Böttcher, E. Holger, et al., "MSM Photodetectors: Modeling and Performance," IEEE J. Quantum Elec., vol. 28, No. 10, Oct. 1992, pp. 2343–2357.

*Primary Examiner*—Minh-Loan Tran
*Attorney, Agent, or Firm*—Fleshner & Kim

[57] ABSTRACT

A semiconductor device having a spiral electrode pattern and fabrication method thereof. The device includes an undoped semiconductor substrate, a first and a second probing pads formed on the substrate, and a pair of electrode fingers extending spirally toward a concentric center from the respective first and second probing pads and interdigitated with each other. The method includes the steps of, patterning an insulation layer on a semiconductor substrate in a spiral structure, depositing a metal layer on the substrate including the insulation layer but excluding the sides of the insulation layer, and etching the insulation layer using a wet etching technique.

8 Claims, 5 Drawing Sheets

5,780,915

1

SEMICONDUCTOR DEVICE HAVING SPIRAL ELECTRODE PATTERN

BACKGROUND OF THE INVENTION

1. Field of the Invention

The present invention relates to a semiconductor device, and more particularly to a semiconductor device having a spiral electrode pattern and to a fabrication method thereof for obtaining a high speed response property and improving a dark/photo current-voltage property as well as decreasing internal gain and early breakdown which results from high electric fields, by laying-out a spiral electrode pattern in a photo detector having a metal-semiconductor-metal (MSM) structure and reducing the number of finger tips of the electrodes.

2. Description of the Prior Art

As shown in FIG. 1 showing a plan view according to a first embodiment of a conventional electrode pattern, probing pads 1, 2 respectively have a plurality of electrode fingers 1a, 2a shaped after teeth of a comb, which fingers 1a, 2a are interdigitated without being in contact with each other.

To fabricate the electrode-patterned semiconductor device, a positive photoresist film is coated and patterned using photolithography on an undoped substrate formed of an element selected from groups III-V of the periodic table, and a Schottky metal such as Ti/Au, Al or Ti/Pt/Au is deposited by using the patterned photoresist film as a mask. Then, a lif-toff technique is applied to remove an undesired portion other than the deposited metal to thereby form the electrode fingers and the probing pad. Here, the plurality of electrode fingers 1a, 2a in FIG. 1 constitute an active region, and reference numerals W, S, 11, and 12 respectively denote an electrode finger width, an electrode finger space, a length between the probing pads, and a vertical length between the sides of the probing pad.

However, the conventional semiconductor device having an electrode pattern has increased current gain as well as leakage current which results from an electric field cloud phenomenon occurring at peak points of the electrode fingers due to the pointed tips thereof, further resulting in a decreased signal response speed.

In FIG. 2, showing a second embodiment of the conventional semiconductor device having an electrode pattern, with reference to IEEE PHOTONICS TECHNOLOGY LETTERS, VOL. 2, NO. 1, JANUARY 1990, p56, a finger tip 6 is shaped to be round thus to decrease an electric field cloud phenomenon, compared to the case of pointed finger tips. However, the finger tip region, except for a central part of the electrode, is not exposed to light due to the circular shape of an actual light source and accordingly not applicable to a practical use and thus the rounded finger tips are not effective enough to reduce the electric field cloud phenomenon, thereby increasing dark current due to the multiple electrode finger tips, and furthermore a rounded finger tip leads to an unnecessarily wide active region which results in an increased capacitance.

As shown in FIG. 3, in the conventional semiconductor device having an electrode pattern, a voltage applied to a respective electrode causes a depletion region to be formed in the semiconductor which is under the electrode, thus to form a non-uniform electric field 8, and then to the active region there is illuminated an energy hυ of light thus to form an electron hole pair (EHP) proportional thereto so that electrons move to the + electrode and holes move to the

2 electrode; here, when the electrons and the holes reach an opposite electrode, electrical current can be measured externally. Also, because density of the electric field lines formed about a material decrease as the distance from the surface of the material increases, the carriers formed by light receive much less power thus reducing the moving speed thereof, and the carrier life-time is also affected which causes current to be reduced and accordingly a signal response becomes slower.

As shown in FIG. 4 showing an energy band diagram of the conventional semiconductor device having an electrode pattern, a hole and an electron respectively jump over a potential barrier at an anode and a cathode to influence an external current, and such effect is referred to as a dark current which is proportionally effected by the applied voltage, the kinds of deposited metal and an operational temperature of the device.

Accordingly, as the applied voltage is higher, an image force lowering occurs according to an expression, $\Delta\phi_{B, np} = \sqrt{qV/4\pi\epsilon L}$, whereby $\Delta\phi_B$ (V) is the metal-to-semiconductor barrier height so that more electrons and holes are injected into the semiconductor thus to cause more dark current to flow. This phenomenon generally occur s at the finger tips and significantly influences the internal gain.

Meanwhile, in FIG. 4, qv denotes potential energy, Ev denotes balance band energy, Ec denotes conduction band energy, Jh denotes hole leakage current density, and Je denotes electron leakage current density.

SUMMARY OF THE INVENTION

Therefore, it is an object of the present invention to provide a semiconductor device having a spiral electrode pattern capable of decreasing an electric field cloud phenomenon and the number of electrode fingers to thereby reduce leakage current.

To achieve the above-described object, the semiconductor device having a spiral electrode pattern in accordance with a preferred embodiment of the present invention includes an undoped semiconductor substrate, a first and a second probing pads formed on the substrate, and a pair of electrode fingers extended spirally toward a concentric center from the respective first and second probing pads and interdigitated with each other.

The fabrication method of the semiconductor device having a spiral electrode pattern in accordance with the present invention includes the steps of patterning an insulation layer on a semiconductor substrate in a spiral structure, depositing a metal layer on but excluding sides of the substrate having the insulation layer thereon, and etching the insulation film using a wet etching technique.

DETAILED DESCRIPTION OF THE PRESENT INVENTION

Figure 1:
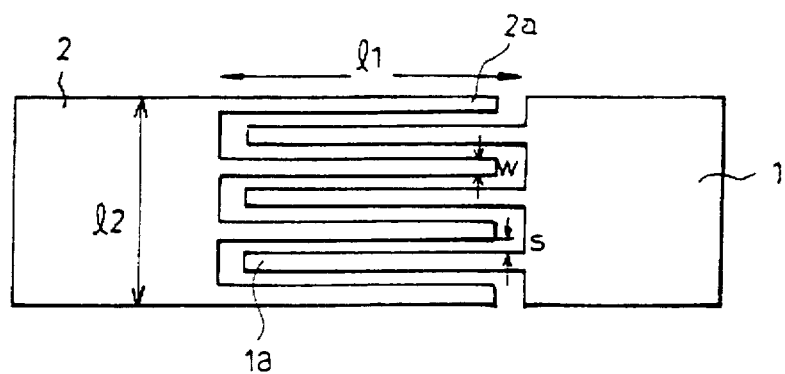
FIG. 1 is a schematic plan view of an electrode pattern according to a first embodiment of a conventional art.
Figure 2:
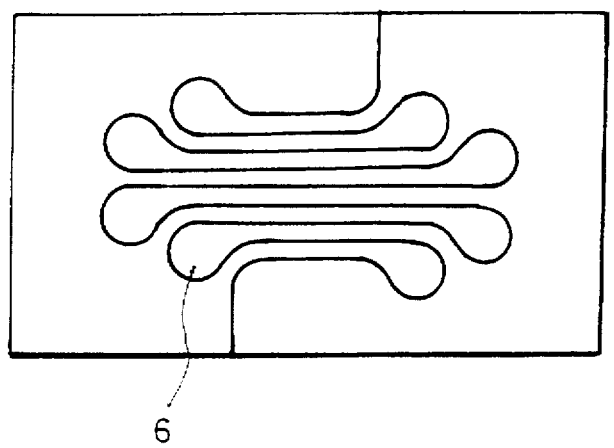
FIG. 2 is a schematic plan view of an electrode pattern according to a second embodiment of a conventional art.
Figure 3:
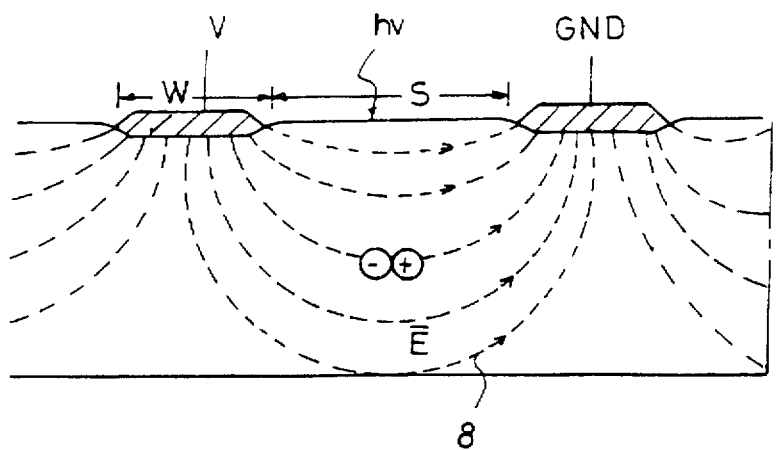
FIG. 3 is a schematic cross-sectional view showing an influence of electric field inside a semiconductor device having a conventional electrode pattern.
Figure 4:
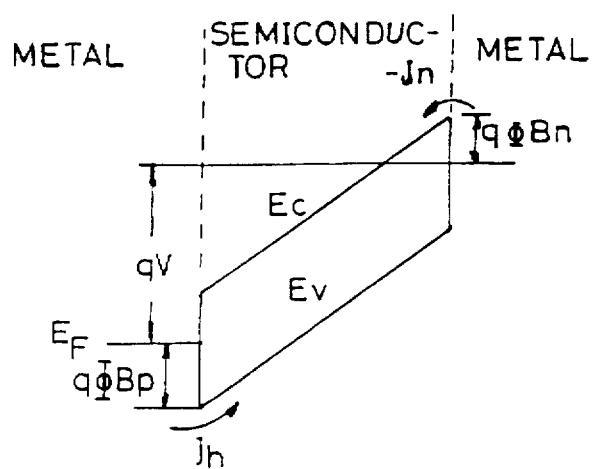
FIG. 4 is a graph showing a semiconductor device having a conventional electrode pattern.
Figure 5:
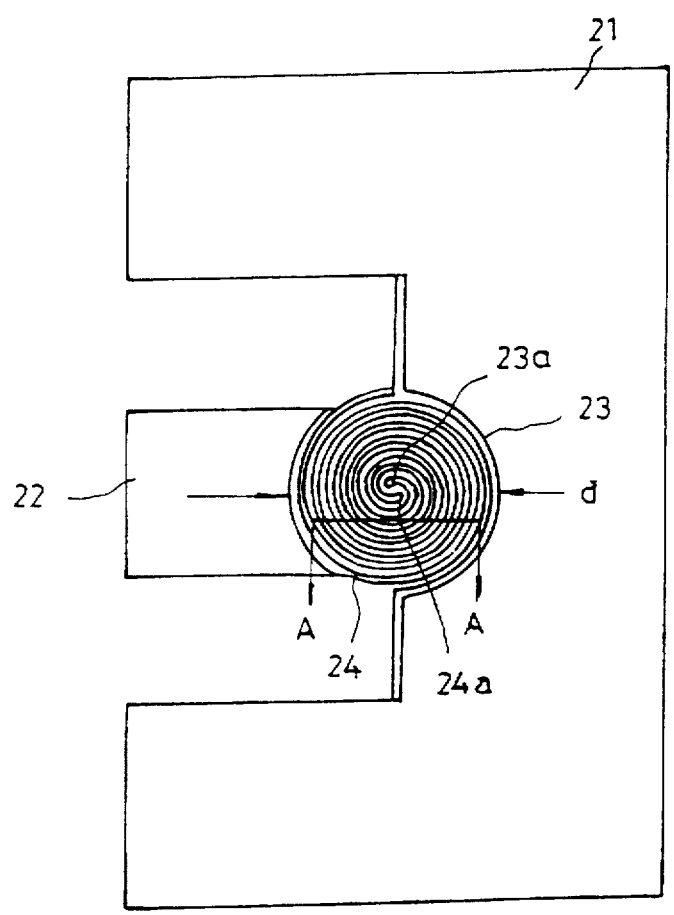
FIG. 5 is a schematic plan view of a spiral electrode pattern according to the present invention.

As shown in FIG. 5, in a spiral electrode pattern according to the present invention, a pair of electrode fingers 23, 24 each extending spirally toward a concentric center from a corresponding one of a pair of probing pads 21, 22 are interdigitated with each other. Also, finger tips 23a, 24a of the respective electrode fingers 23, 24 are formed in a round shape to thereby decrease an electric field cloud phenomenon. Here, reference numeral d denotes a diameter of the active region which is formed in a circular shape so as to correspond to the shape of a general input light beam. With reference to FIGS. 6A–6D, the semiconductor device having a spiral electrode pattern in accordance with FIG. 5 will be described.

Figure 6A:
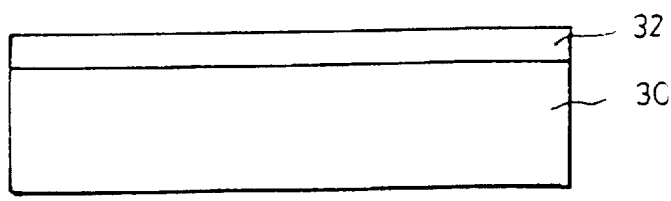
FIGS. 6A–6D are process views of a cross-section taken along line A—A in FIG. 5.

First, as shown in FIG. 6A, a photoresist film 32 serving as an insulation layer is coated on an undoped semiconductor substrate 30 formed of an element selected from groups III-V of the periodic table, and the insulation layer may be formed from either an oxide film or a nitride film.

Figure 6B:
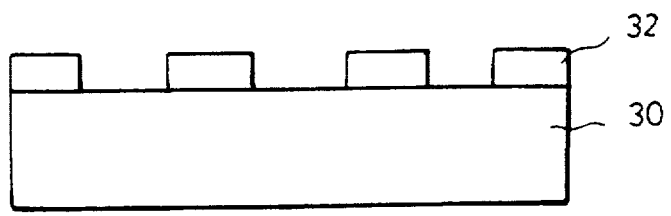

Next, an electron beam is scanned on the photoresist film 32 thus to form a spirally patterned structure as shown in FIG. 6B.

Figure 6C:
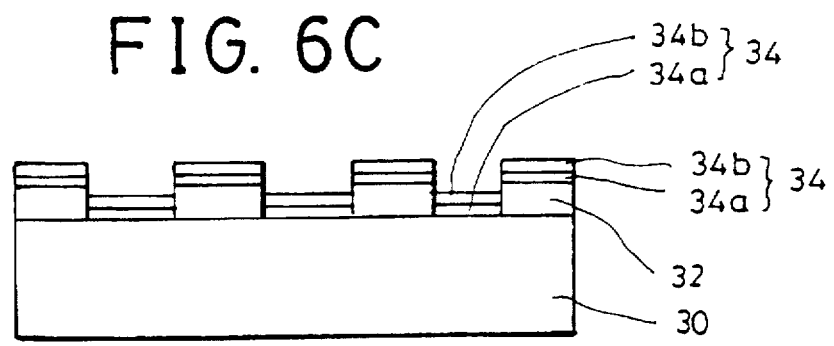

Then, as shown in FIG. 6C, on the substrate 30 including the patterned photoresist film 32 there is formed a metallic film 34 using a method such as an electron beam (EB) evaporation method or sputtering. The metallic layer is formed by depositing about 350 Å of Ta or Ti (34a) and then about 1500 Å of Au (34b), respectively. At this time, the metallic layer is deposited on the photoresist film and on the exposed substrate but not on the sides of the photoresist film.

Figure 6D:
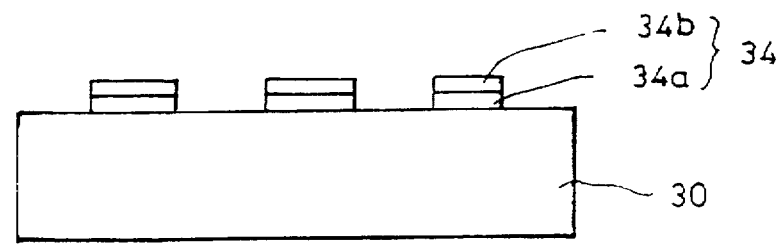

Subsequently, as shown in FIG. 6D, the patterned photo resist film 32 is removed by wet etching and a lift-off process and accordingly, the metallic layer 34 on the photoresist film 32 is removed, thereby leaving the patterned metallic layer 34 on the substrate 30.

Figure 7:
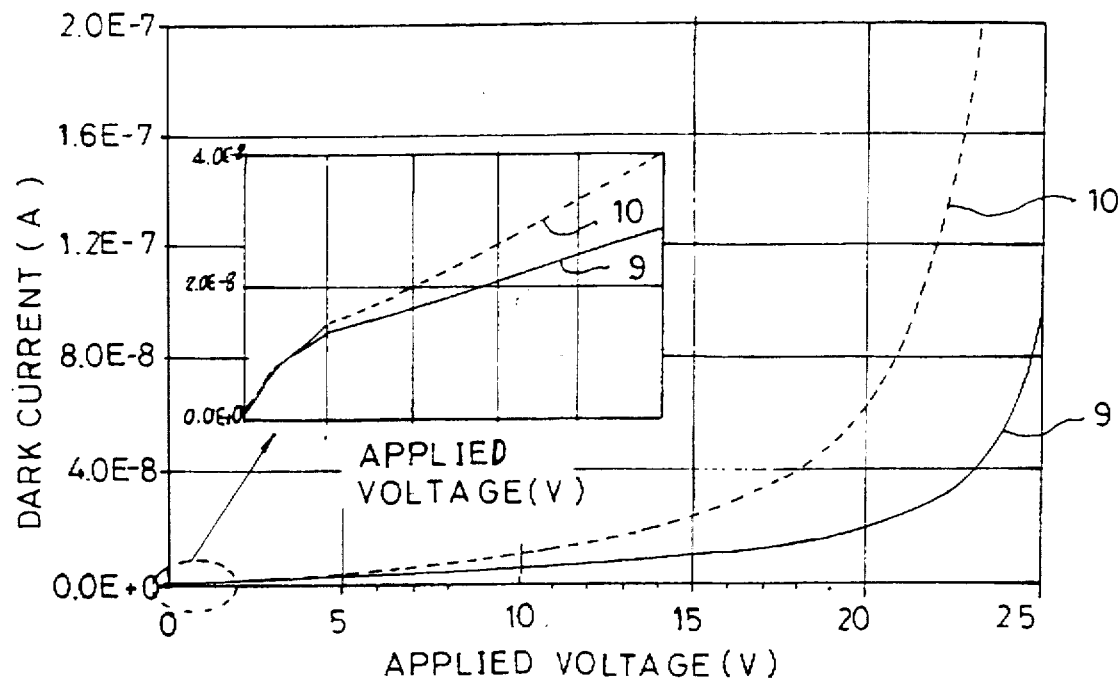
FIG. 7 is a graph showing the relation between voltage and dark current.

As shown in FIG. 7 showing the relation between voltage and dark current according to the present invention and the conventional art, a current-voltage property 9 of a semiconductor device according to the present invention decreases an electric field cloud phenomenon by reducing the number of pointed finger tips, thereby reducing the dark current, compared to the current-voltage property 10 according to the conventional semiconductor device. This effect becomes more apparent when a higher voltage is applied.

Therefore, in a low voltage interval shown as a broken line in FIG. 7, leakage current and internal gain result from a carrier injection and a thermal energy injection in accordance with the image force lowering caused by a Schottky metal, whereas in a high voltage interval, leakage current and internal gain are generated mainly due to an impact ionization occurring partially at the finger tips.

Although the semiconductor device having a spiral electrode pattern according to the present invention influences an impulse response caused by an increased impedance because of the longer electrode, such undesired disadvantage can be overcome by decreasing an active region.

Figure 8:
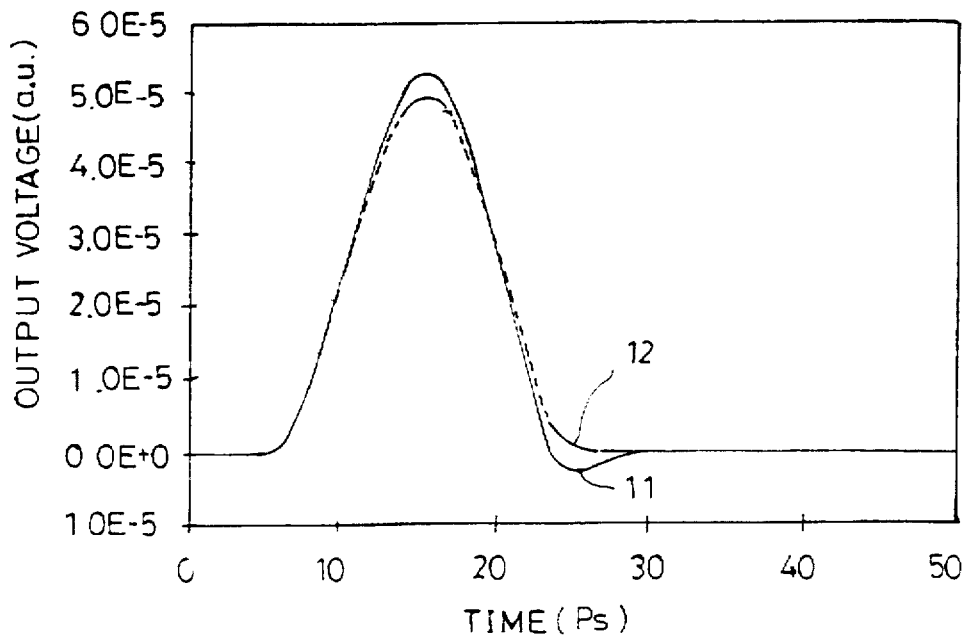
FIG. 8 is a graph showing an impulse response according to simulation results.

FIG. 8 showing an impulse response according to a simulation result with regard to the present invention and the conventional art incorporates that an impulse response and a trailing edge profile which denote a curve 11 according to a spiral electrode pattern have been improved in accordance with a known inductance peaking, compared to a curve 12 according to the conventional electrode pattern.

In particular, the spiral electrode pattern for a semiconductor device according to the present invention enhances a coupling efficiency because such spiral electrode pattern matches the shape of an optical fiber used in telecommunications.

Further, with regard to a voltage-optical current relation of the spiral electrode pattern according to the present invention, an internal direct gain at a high voltage is decreased significantly compared to a semiconductor device having a conventional electrode pattern.

What is claimed is:

1. A semiconductor device having a spiral electrode pattern, comprising:

an undoped semiconductor substrate;

a first and a second probing pads formed on the substrate; and a pair of electrode fingers extending spirally toward a concentric center from the respective first and second probing pads and the electrode fingers being interdigitated with each other, wherein a thickness of the electrode fingers on the substrate is approximately 1850 Å.

2. The device of claim 1, wherein a circular portion of the electrode fingers constitute an active region.

3. The device of claim 1, wherein the substrate is formed of an element selected from groups III-V of the periodic table.

4. The device of claim 1, wherein each tip of the electrode fingers is round.

5. A semiconductor device having a spiral electrode pattern, comprising:

a semiconductor substrate;

at least one probing pad formed on the substrate; and a pair of electrode fingers extending spirally from the probing pad/pads, wherein a thickness of the electrode fingers is approximately 1850 Å.

6. The device of claim 5, wherein a circular portion of the electrode fingers constitute an active region.

7. The device of claim 5, wherein the substrate is formed of an element selected from groups III-V of the periodic table.

8. The device of claim 5, wherein each tip of the electrode fingers is round.

\* \* \* \* \*